US012666537B2

(12) United States Patent
Rivera et al.

(10) Patent No.: US 12,666,537 B2
(45) Date of Patent: Jun. 23, 2026

(54) FLEXIBLE AND STRETCHABLE STRUCTURES

(71) Applicant: Liquid Wire Inc., Portland, OR (US)

(72) Inventors: Trevor Antonio Rivera, Portland, OR (US); Michael Adventure Hopkins, Portland, OR (US); Mark William Ronay, Portland, OR (US)

(73) Assignee: Liquid Wire Inc., Portland, OR (US)

( * ) Notice: Subject to any disclaimer, the term of this patent is extended or adjusted under 35 U.S.C. 154(b) by 218 days.

(21) Appl. No.: 18/292,757

(22) PCT Filed: Jul. 29, 2022

(86) PCT No.: PCT/US2022/074296
§ 371 (c)(1),
(2) Date: Jan. 26, 2024

(87) PCT Pub. No.: WO2023/010106
PCT Pub. Date: Feb. 2, 2023

(65) Prior Publication Data
US 2025/0016931 A1     Jan. 9, 2025

Related U.S. Application Data

(60) Provisional application No. 63/203,796, filed on Jul. 30, 2021.

(51) Int. Cl.
H05K 1/18          (2026.01)
H05K 1/03          (2006.01)
H05K 1/189         (2026.01)

(52) U.S. Cl.
CPC ............. H05K 1/189 (2013.01); H05K 1/038 (2013.01); H05K 2201/0133 (2013.01)

(58) Field of Classification Search
CPC . H05K 1/189; H05K 1/038; H05K 2201/0133
(Continued)

(56) References Cited

U.S. PATENT DOCUMENTS 9,585,245 B2 * 2/2017 Li ........................ A61B 5/6824
9,860,979 B2 * 1/2018 Ichiryu .................. H05K 1/185
(Continued)

FOREIGN PATENT DOCUMENTS

WO       WO-2018123818 A1       7/2018
WO       WO-2023010106 A1       2/2023
WO       WO-2023034886 A1       3/2023

OTHER PUBLICATIONS

"U.S. Appl. No. 17/446,598, Non Final Office Action mailed May 23, 2023", 18 pgs.
(Continued)

*Primary Examiner* — Binh B Tran
(74) *Attorney, Agent, or Firm* — Quinn IP Law

(57) ABSTRACT

Devices, systems, and methods include a substrate layer, a metal layer coupled to the substrate layer, an encapsulant coupled to the substrate layer and the metal layer, and a stencil-in-place structure. The encapsulant is configured to electrically isolate the metal layer from environmental conditions. The stencil-in-place structure includes a stencil substrate and conductive gel secured within a channel and a via formed by the stencil substrate, the conductive gel electrically coupled to the metal layer.

23 Claims, 2 Drawing Sheets

102                                                                      104

106

(58) Field of Classification Search
    USPC ............................................................ 361/749
    See application file for complete search history.

(56)                     References Cited

U.S. PATENT DOCUMENTS

| | | | | |
|---|---|---|---|---|
| 10,310,560 | B2 * | 6/2019 | Choi ...................... | H05B 33/14 |
| 10,672,530 | B2 | 6/2020 | Ronay | |
| 10,943,893 | B2 * | 3/2021 | Jung ...................... | H10K 59/18 |
| 11,088,063 | B2 | 8/2021 | Ronay et al. | |
| 12,114,982 | B2 * | 10/2024 | Lee ...................... | A61B 5/4205 |
| 2005/0136646 | A1 | 6/2005 | Larnerd et al. | |
| 2005/0189645 | A1 | 9/2005 | Nakano et al. | |
| 2006/0274055 | A1 | 12/2006 | Reynolds et al. | |
| 2012/0160547 | A1 | 6/2012 | Antesberger et al. | |
| 2012/0176764 | A1 | 7/2012 | Loher et al. | |
| 2014/0299362 | A1 * | 10/2014 | Park ...................... | H05K 1/0283 |
| | | | | 174/254 |
| 2014/0321075 | A1 | 10/2014 | Sung et al. | |
| 2018/0247727 | A1 | 8/2018 | Ronay | |
| 2019/0056277 | A1 | 2/2019 | Ronay | |
| 2020/0053875 | A1 | 2/2020 | Holec et al. | |
| 2020/0066628 | A1 | 2/2020 | Ronay et al. | |
| 2020/0344880 | A1 | 10/2020 | Uno et al. | |
| 2020/0381349 | A1 | 12/2020 | Ronay et al. | |
| 2020/0386630 | A1 | 12/2020 | Ronay et al. | |
| 2021/0193543 | A1 * | 6/2021 | Liu ...................... | H01L 21/56 |
| 2022/0071014 | A1 | 3/2022 | Ronay et al. | |

OTHER PUBLICATIONS

"U.S. Appl. No. 17/446,598, Response filed Nov. 22, 2023 to Non Final Office Action mailed May 23, 2023", 8 pgs.

"International Application Serial No. PCT/US2022/074296, International Search Report mailed Jan. 10, 2023", 6 pgs.

"International Application Serial No. PCT/US2022/074296, Invitation to Pay Additional Fees mailed Nov. 10, 2022", 10 pgs.

"International Application Serial No. PCT/US2022/074296, Written Opinion mailed Jan. 10, 2023", 10 pgs.

"International Application Serial No. PCT/US2022/075795, International Search Report mailed Dec. 16, 2022", 4 pgs.

"International Application Serial No. PCT/US2022/075795, Written Opinion mailed Dec. 16, 2022", 6 pgs.

* cited by examiner

FLEXIBLE AND STRETCHABLE STRUCTURES

CLAIM OF PRIORITY

This patent application is a U.S. National Stage Filing under 35 U.S.C. 371 from International Application No. PCT/US2022/074296, filed on Jul. 29, 2022, which claims the benefit of priority to U.S. Application Ser. No. 63/203, 796, filed Jul. 30, 2021, each of which are incorporated by reference herein in their entirety.

BACKGROUND

Flexible electronic circuits may be utilized in a variety of situations in which an article with such electronics may be expected to be flexed, stretched or bent routinely as part of use of the article, such as in apparel and wearable articles as well as other consumer and industrial applications. To the extent that electronics are manufactured to be flexible and stretchable as would be understood by a typical user, such characteristics are typically constrained by multiple factors. Among such constraints is thickness or size in general. Because conventional wires and circuit boards are made of materials such as copper, silver and the like, to become flexible, stretchable or routinely bendable along multiple axes those components are often thin in comparison with otherwise similar components utilized in otherwise similar ways.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Example methods and systems are directed to a flexible and stretchable system, system, and method. Examples merely typify possible variations. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

A flexible and stretchable structure has been developed that may be adapted to a variety of systems with a variety of components to provide electrical connectivity between and among the various components. The flexible and stretchable structure provides for the inclusion of conductive gel or other fluid phase conductor which provides further electrical connectivity between and among the various components with further improved flexibility and stretchability. The flexible and stretchable structure also facilitates the inclusion of stencil-in-place structures, as disclosed herein. The various systems that may be formed with the use of the flexible and stretchable structure may readily be incorporated into textile systems.

Figure 1:
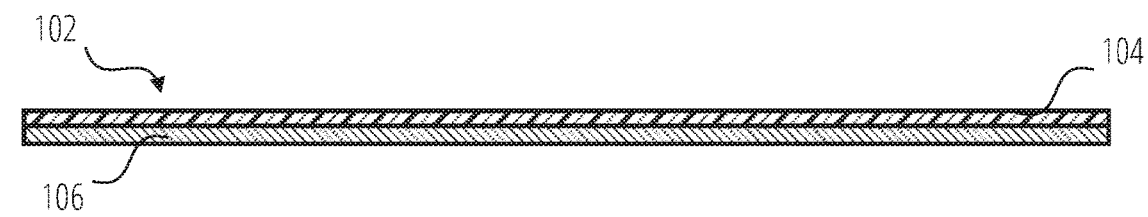
FIG. 1 is an example of a flexible and stretchable structure, in an example embodiment.

FIG. 1 is an example of a flexible and stretchable structure 102, in an example embodiment. The flexible and stretchable structure 102 includes a substrate layer 104 and a metal layer 106 on a major surface of the substrate layer 104. In various examples, the metal layer 106 is deposited onto the substrate layer 104. The metal layer 106 may be, e.g., oxygen-free copper secured to the substrate layer 104 according to any suitable mechanism. In various examples, the metal layer 106 is or includes a metal foil, which may be laminated to the substrate layer 104 in using a rolling operation in optionally in combination with at least one of heat and pressure. In various examples, the substrate layer 104 is formed from one of: a thermoset or thermoplastic film, such as a B-stage resin film, a C-stage resin film, an adhesive, a thermoset epoxy-based film or other stretchable film, thermoplastic polyurethane (TPU), and/or silicone, among other suitable compounds or materials. In one example, the flexible and stretchable structure 102 comprises a copper-clad epoxy-based film.

While two layers are illustrated, i.e., the substrate layer 104 and the metal layer 106, it is to be recognized and understood that in this and in the various examples herein incorporating the flexible and stretchable structure 102 or structures formed according to the principles of the flexible and stretchable structure 102 that the number of layers may be increased as desired, e.g., according to an alternating pattern of substrate layers 104 and metal layers 106. Thus, examples herein with the flexible and stretchable structure 102 may incorporate multiple substrate layers 104 and/or metal layers 106, each configured in different ways as desired.

The flexible and stretchable structure 102 may utilize the metal layer 106 to electrically couple to or with external components of a wider system, such as a power source, external processor, control circuitry, and various discrete electrical components and the like. Details of a substrate layer 104 are disclosed in U.S. Patent Application Publication No. 2020/0381349, "CONTINUOUS INTERCONNECTS BETWEEN HETEROGENEOUS MATERIALS", Ronay et al., which is incorporated by reference herein in its entirety.

Additionally or alternatively, the substrate layer 104 may have the following properties: tensile elongation of 550%; tensile modulus of 5.0 megapascals; recovery rate of 95%; thickness of 100 micrometers; a peel strength at 90 degrees of at least 1.0 kilonewtons per meter; a dielectric constant of 2.3 at 10 gigahertz; a dielectric dissipation factor of 0.0030 at 10 gigahertz; a breakdown voltage of 7.0 kilovolts at a thickness of 80 micrometers; a heat resistance that produces no change in an environment of 260 degrees Celsius for 10 cycles in a nitrogen atmosphere; and chemical resistance producing no change to the substrate layer 104 after 24 hours immersion in any of NaOH, Na2CO3, or copper etchant. In an example, the flexible and stretchable structure 102 may be or may include a second metal layer, e.g. a foil or other cladding, on a second major surface of the substrate layer 104 opposite the major surface on which the metal layer 106 is positioned, as illustrated. In various examples, the flexible and stretchable structure 102 may be or may include the structure disclosed in Patent Cooperation Treaty Application No. PCT/JP2017/045989, STRETCHABLE MEMBER WITH METAL FOIL, Tangyii et al., ("the '989 application") which is incorporated by reference herein in its entirety.

Figure 2A:
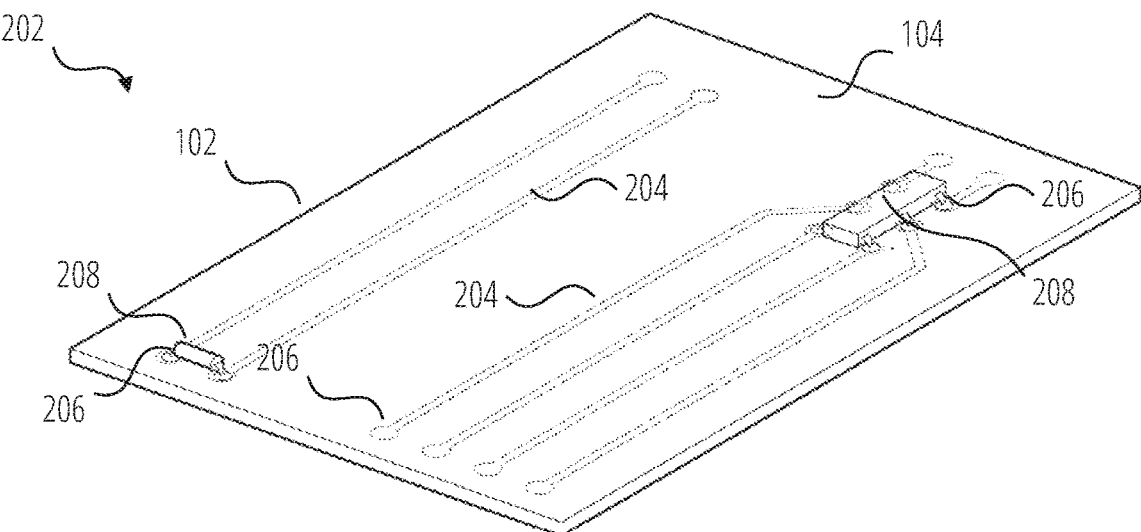
FIGS. 2A and 2B are top and bottom views, respectively, of a system including a flexible and stretchable structure, in an example embodiment
Figure 2B:
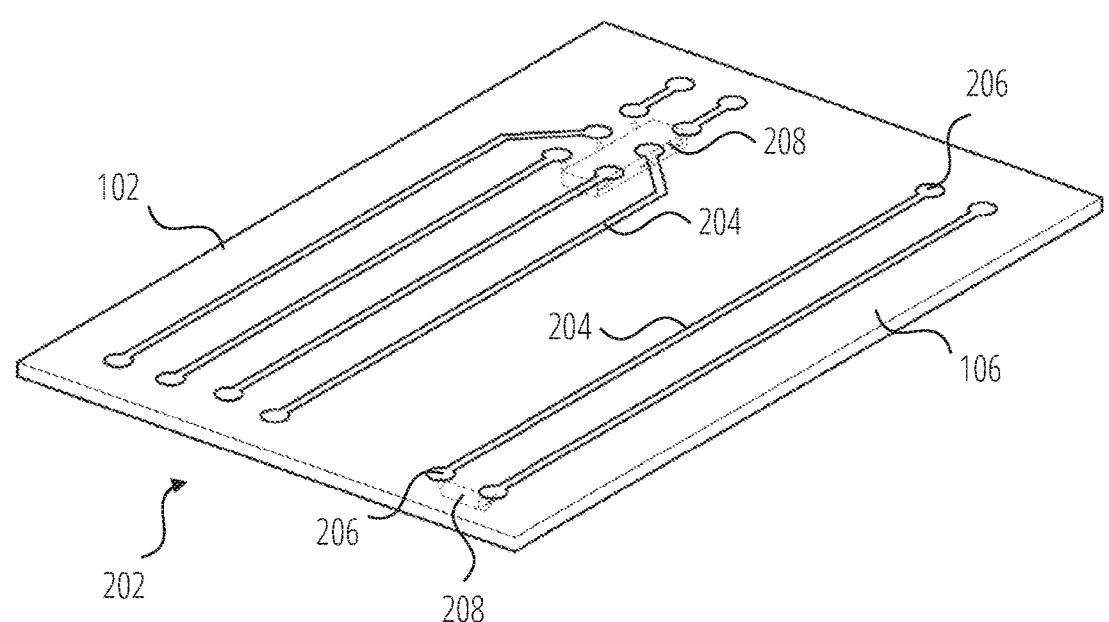

FIGS. 2A and 2B are top and bottom views, respectively, of a system 202 including the flexible and stretchable structure 102, in an example embodiment. As illustrated, the metal layer 106 has been etched, die cut, or otherwise formed into electrical traces 204 and vias 206, with the vias extending through the substrate layer 104 and utilized to electrically couple various discrete electronic components 208. In various examples, at least one metal layer 106 may, in whole or in part, function as a ground plane instead of or in addition to functioning as electrical traces 204. In various examples, the vias 206 may be formed from a conductive gel or other fluid phase conductor extending through the substrate layer 104 from a contact pad on the metal layer 106. Contact pads may have diameters that are larger than trace widths to ensure adequate contact with vias that have larger diameters than the trace widths, and/or to provide a tolerance for indexing variations during the layup of an exemplary structure. In such examples, an adhesive may be positioned between the substrate layer 104 and the electronic component 208 or the substrate layer 104 may have an adhesive characteristic, or the substrate layer 104 may itself be an adhesive. Additionally or alternatively, the vias 206 may include conventional low melt solder, a conductive epoxy, or any other suitable conductive material that may aid in mechanically and electrically coupling the electronic components 208 to the flexible and stretchable structure 102. Further additionally or alternatively, the vias 206 may include a potting agent or other encapsulant.

As noted, the electronic components 208 may be attached on the substrate layer 104, e.g., from being soldered to the vias 206 and/or to pads formed thereby, from an adhesive, and/or from any other suitable mechanism. However, in various examples, one or more electronic components 208 may be attached on and electrically coupled to the metal layer 106. Moreover, where, as with the flexible and stretchable structure 102 formed from the structure disclosed in the '989 application, the electronic components 208 may be attached to one or more of the metal layers.

In various examples, the substrate layer 104 operates as an encapsulant for conductive gel utilized in the vias 206. The vias 206 may be formed in the substrate layer 104 with laser ablation, drilling, or any other suitable mechanism. In such an example, the substrate layer 104 serves to contain and hold in place, at least in part, the conductive gel and prevent the conductive gel from spreading or otherwise leaving the via 206 sufficient to prevent the via 206 from being functional as a via 206. It is to be recognized and understood that while a conductive gel is described herein, the principles of use described with respect to the conductive gel specifically may be generally applicable to any fluid phase conductor known in the art or which may be developed, including the conductive gel. Thus, references herein to the conductive gel are to be understood to be without limitation and that any suitable fluid phase conductor may be utilized instead of or in addition to the conductive gel.

Figures 3, 4:
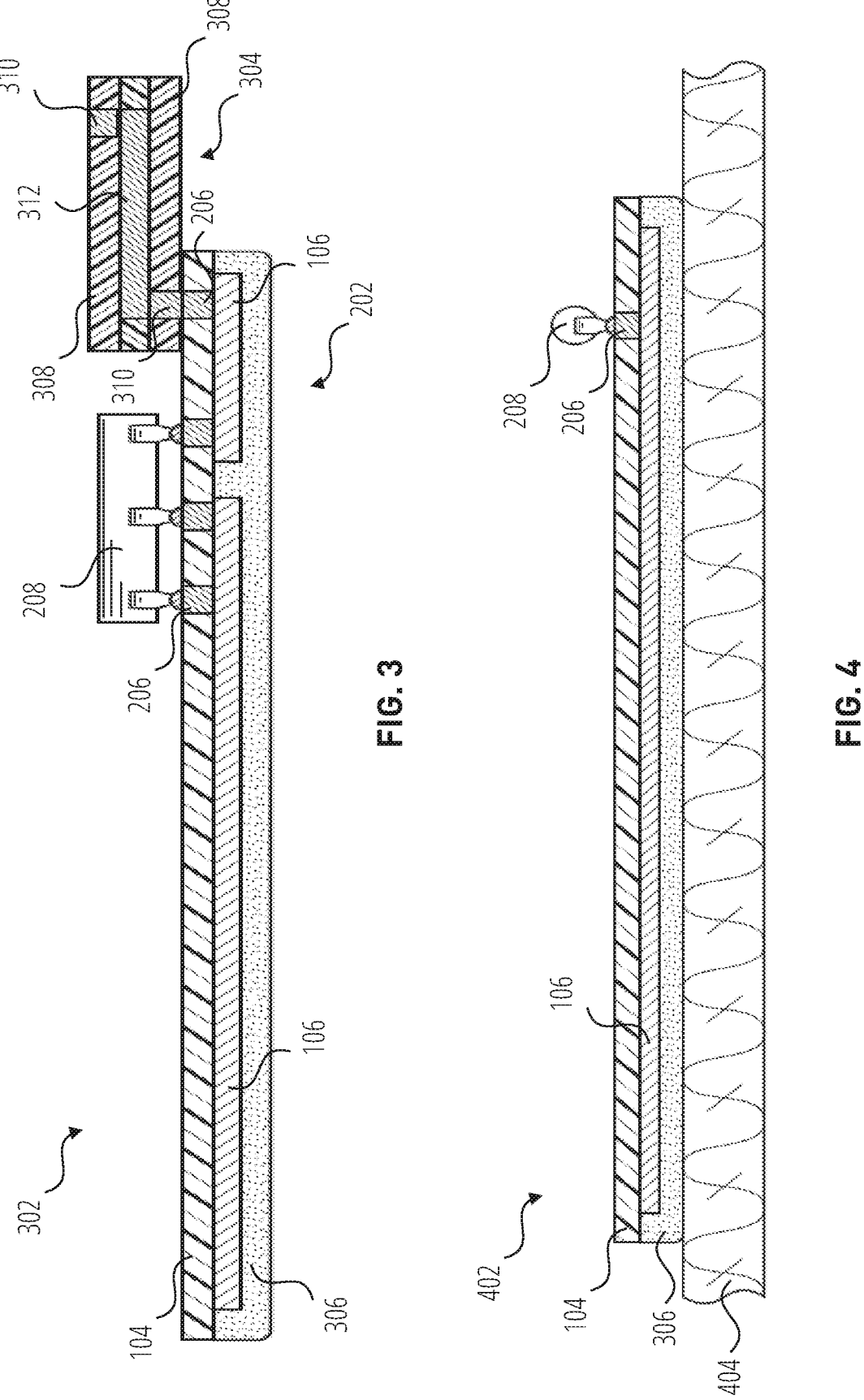
FIG. 3 is a cutaway image of a system including a stencil-in-place structure, in an example embodiment
FIG. 4 is a cutaway depiction of a textile system, in an example embodiment

FIG. 3 is a cutaway image of a system 302 including a "stencil-in-place" structure 304, in an example embodiment. The system 302 may include components and structures described in the system 202 (FIG. 2A and FIG. 2B) including the substrate layer 104, metal layer 106 patterned to form forming electrical traces 204 (FIG. 2A and FIG. 2B), vias 206, and an electronic component 208. The system 302 further includes an encapsulant 306 configured to encapsulate the metal layer 106 and isolate the metal layer 106 from environmental conditions. In various examples, the encapsulant 306 is formed from TPU, a B-stage resin or other thermosetting film, a C-stage resin or other thermosetting film, a thermosetting resin generally, an elastomer generally, or some combination of the preceding examples, or any other suitable encapsulant that achieves the necessary degree of flexibility, stretchability, dielectric and other properties that shall become apparent from the examples disclosed herein.

The stencil-in-place structure 304 includes stencil substrate layers 308 forming at least one via 310 and at least one slot or channel 312 containing conductive gel. In various examples, the conductive gel fills the vias 310 and the channel 312. The stencil-in-place structure 304 thus forms a conductive path of conductive gel which may be electrically coupled to the other components of the system 302 generally. Details of the stencil-in-place structure 304 and methods of making the stencil-in-place structure 304 are disclosed in U.S. Patent Application Publication No. 2020/0066628, "STRUCTURES WITH DEFORMABLE CONDCUTORS", Ronay et al., which is incorporated by reference herein in its entirety. In various examples, the stencil substrate layers 308 may be stretchable and comprised of an adhesive or thermoplastic adhesive film, a B-stage resin, or other suitable material.

As illustrated, the stencil-in-place structure 304 is positioned on a major surface of the stencil-in-place structure 304 generally formed by the substrate layer 104 and shared with the electronic component 208. However, it is to be recognized and understood that additional examples provide for the stencil-in-place structure 304 to be positioned at other locations in the system 302. Thus, by way of example, the stencil-in-place structure 304 may be positioned on and adhered or otherwise attached to a major surface of the system 302 defined by the encapsulant 306. In such an example, a via may be formed in the encapsulant to electrically couple the stencil-in-place structure 304 with other components of the system 302. Moreover, it is to be recognized and understood that more than one stencil-in-place structure 304 may be incorporated in the system 302 and that such stencil-in-place structures 304 may be positioned at any desired location. Thus, in various examples, one or more stencil-in-place structures 304 may be positioned on the substrate layer 104 and/or on the encapsulant 306 or on any other suitable component of the system 302. While stencil-in-place structures are shown for illustrative purposes, it is to be recognized and understood that the principles disclosed herein may be applied to any of a variety of alternative structures, including but not limited to any structures disclosed in Patent Cooperation Treaty application PCT/US2022/070853, "DEVICES, SYSTEMS, AND METHODS OF MAKING AND USING HIGHLY SUSTAINABLE CIRCUITS", Kruskopf et al., filed Feb. 25, 2022, which is incorporated by reference herein in its entirety.

FIG. 4 is a cutaway depiction of a textile system 402, in an example embodiment. The textile system 402 includes the substrate layer 104 and the metal layer 106 as described with respect to the flexible and stretchable structure 102. The encapsulant 306 encapsulates the metal layer 106. A via 206 formed, e.g., of conductive gel electrically couples an electronic component 208 to the metal layer 106. In the illustrated example, the encapsulant 306 is secured to a textile 404, e.g., a fabric or other material made according to any suitable technique, such that the various components may flex, stretch, or otherwise move in conjunction with the textile 404. In various examples, the textile 404 is comprised of non-conductive or insulative fibers, filaments, or threads, e.g., nylon or other suitable non-conductive material. In various additional or alternative examples, the textile 404 may incorporate conductive threads or fibers in addition to or instead of the non-conductive fibers. In various examples, the encapsulant 306 is bonded to the textile 404, though any suitable mechanism for attachment of the encapsulant 306 to the textile 404 may be implemented.

As in the above systems, the textile system 402 is presented for example and not for limitation, and it is to be recognized and understood that various combinations and permutations of components disclosed herein may be implemented. Thus, in various examples, the textile system 402 may couple the textile 404 to the substrate layer 104 instead of or in addition to the encapsulant 306, or to any other suitable component of the textile system 402. In various examples, the textile system 402 may incorporate one or more stencil-in-place structures 304 positioned at any suitable location on the substrate layer 104, encapsulant 306, or any other components, as disclosed herein.

In all examples, a structure may be constructed additively in a layer by layer process, where each layer is formed and placed on top (or below) previously assembled layers. Thus, each layer may be customized in many different ways so as to provide desired characteristics of the overall structure. Each layer may be formed from substantially one materially, with the exception of a stencil layer, which as described above, has slots or channels filled with conductive gel. However, it should be noted that for low power circuits, the volume of metal required to perform the functions contemplated for the structures disclosed herein is relatively minimal. Thus, the resulting thicknesses of a metal layer may be very small, e.g., 200 microns or less, or approximately 0.010" inches or less. Handling and assembling a layer this thin may be difficult in a manufacturing environment. Thus, e.g., the metal layer(s) 106 and, e.g., substrate layer(s) 104 may be provided as one film or layer when assembling, e.g., the structures 102. Furthermore, the single layer may be processed prior to assembly to a structure, for example, to remove un-needed metal material, for example by chemical etching as described above. Alternatively, the metal layer may be deposited additively to a laminate structure as a discrete layer. It may be advantageous to additively provide the metal layer when the structure requires the metal layer to have a relatively large surface area to perform the contemplated function, e.g.: to provide RF shielding to a circuit; act as a high power bus; to serve as a ground plane; or other functions or configurations that may require a relatively large pattern or sheet of metal layer, or that may be easily provided as a discrete layer during a manufacturing operation.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms.

Modules may constitute either software modules (e.g., code embodied on a machine-readable medium or in a transmission signal) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a field programmable gate array (FPGA) or an ASIC. A hardware module may also include programmable logic or circuitry that is temporarily configured by software to perform certain operations. For example, a hardware module may include software encompassed within a general-purpose processor or other programmable processor. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, a processor being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an application program interface (API)).

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

The electrically conductive compositions, such as conductive gels, comprised in the articles described herein can, for example, have a paste like or gel consistency that can be created by taking advantage of, among other things, the structure that gallium oxide can impart on the compositions when gallium oxide is mixed into a eutectic gallium alloy. When mixed into a eutectic gallium alloy, gallium oxide can form micro or nano-structures that are further described herein, which structures are capable of altering the bulk material properties of the eutectic gallium alloy.

As used herein, the term "eutectic" generally refers to a mixture of two or more phases of a composition that has the lowest melting point, and where the phases simultaneously crystallize from molten solution at this temperature. The ratio of phases to obtain a eutectic is identified by the eutectic point on a phase diagram. One of the features of eutectic alloys is their sharp melting point.

The electrically conductive compositions can be characterized as conducting shear thinning gel compositions. The electrically conductive compositions described herein can also be characterized as compositions having the properties of a Bingham plastic. For example, the electrically conductive compositions can be viscoplastics, such that they are rigid and capable of forming and maintaining three-dimensional features characterized by height and width at low stresses but flow as viscous fluids at high stress. Thus, for example, the electrically conductive compositions can have a viscosity ranging from about 10,000,000 Pas to about 40,000,000 Pa*s under low shear and about 150 to 180 at high shear. For example under condition of low shear the composition has a viscosity of about 10,000,000 Pa*s, about 15,000,000 Pa*s, about 20,000,000 Pa*s, about 25,000,000

Pa*s, about 30,000,000 Pa*s, about 45,000,000 Pa*s, or about 40,000,000 Pa*s under conditions of low shear. Under condition of high shear the composition has a viscosity of about 150 Pa*s, about 155 Pa*s, about 160 Pa*s, 165 Pa*s, about 170 Pa*s, about 175 Pa*s, or about 180 Pa*s.

The electrically conductive compositions described herein can have any suitable conductivity, such as a conductivity of from about $2\times10^5$ S/m to about $8\times10^5$ S/m.

The electrically conductive compositions described herein can have any suitable melting point, such as a melting point of from about −20° C. to about 10° C., about −10° C. to about 5° C., about −5° C. to about 5° C. or about −5° C. to about 0° C.

The electrically conductive compositions can comprise a mixture of a eutectic gallium alloy and gallium oxide, wherein the mixture of eutectic gallium alloy and gallium oxide has a weight percentage (wt %) of between about 59.9% and about 99.9% eutectic gallium alloy, such as between about 67% and about 90%, and a wt % of between about 0.1% and about 2.0% gallium oxide such as between about 0.2 and about 1%. For example, the electrically conductive compositions can have about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, about 95%, about 96%, about 97%, about 98%, about 99%, or greater, such as about 99.9% eutectic gallium alloy, and about 0.1%, about 0.2%, about 0.3%, about 0.4%, about 0.5%, about 0.6%, about 0.7%, about 0.8%, about 0.9%, about 1.0%, about 1.1%, about 1.2%, about 1.3%, about 1.4%, about 1.5%, about 1.6%, about 1.7%, about 1.8%, about 1.9%, and about 2.0% gallium oxide.

The eutectic gallium alloy can include gallium-indium or gallium-indium-tin in any ratio of elements. For example, a eutectic gallium alloy includes gallium and indium. The electrically conductive compositions can have any suitable percentage of gallium by weight in the gallium-indium alloy that is between about 40% and about 95%, such as about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

The electrically conductive compositions can have a percentage of indium by weight in the gallium-indium alloy that is between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

The eutectic gallium alloy can include gallium and tin. For example, the electrically conductive compositions can have a percentage of tin by weight in the alloy that is between about 0.001% and about 50%, such as about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, or about 50%.

The electrically conductive compositions can comprise one or more micro-particles or sub-micron scale particles blended with the eutectic gallium alloy and gallium oxide. The particles can be suspended, either coated in eutectic gallium alloy or gallium and encapsulated in gallium oxide or not coated in the previous manner, within eutectic gallium alloy. The micro- or sub-micron scale particles can range in size from nanometer to micrometer and can be suspended in gallium, gallium-indium alloy, or gallium-indium-tin alloy. Particle to alloy ratio can vary and can change the flow properties of the electrically conductive compositions. The micro and nano-structures can be blended within the electrically conductive compositions through sonication or other suitable means. The electrically conductive compositions can include a colloidal suspension of micro and nano-structures within the eutectic gallium alloy/gallium oxide mixture.

The electrically conductive compositions can further include one or more micro-particles or sub-micron scale particles dispersed within the compositions. This can be achieved in any suitable way, including by suspending particles, either coated in eutectic gallium alloy or gallium and encapsulated in gallium oxide or not coated in the previous manner, within the electrically conductive compositions or, specifically, within the eutectic gallium alloy fluid. These particles can range in size from nanometer to micrometer and can be suspended in gallium, gallium-indium alloy, or gallium-indium-tin alloy. Particle to alloy ratio can vary, in order to, among other things, change fluid properties of at least one of the alloy and the electrically conductive compositions. In addition, the addition of any ancillary material to colloidal suspension or eutectic gallium alloy in order to, among other things, enhance or modify its physical, electrical or thermal properties. The distribution of micro and nano-structures within the at least one of the eutectic gallium alloy and the electrically conductive compositions can be achieved through any suitable means, including sonication or other mechanical means without the addition of particles. In certain embodiments, the one or more micro-particles or sub-micron particles are blended with the at least one of the eutectic gallium alloy and the electrically conductive compositions with wt % of between about 0.001% and about 40.0% of micro-particles, for example about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, or about 40.

The one or more micro- or sub-micron particles can be made of any suitable material including soda glass, silica, borosilicate glass, quartz, oxidized copper, silver coated copper, non-oxidized copper, tungsten, super saturated tin granules, glass, graphite, silver coated copper, such as silver coated copper spheres, and silver coated copper flakes, copper flakes, or copper spheres, or a combination thereof, or any other material that can be wetted by the at least one of the eutectic gallium alloy and the electrically conductive compositions. The one or more micro-particles or sub-micron scale particles can have any suitable shape, including the shape of spheroids, rods, tubes, a flakes, plates, cubes, prismatic, pyramidal, cages, and dendrimers. The one or more micro-particles or sub-micron scale particles can have any suitable size, including a size range of about 0.5 microns to about 60 microns, as about 0.5 microns, about 0.6 microns, about 0.7 microns, about 0.8 microns, about 0.9 microns, about 1 microns, about 1.5 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, about 26 microns, about 27 microns, about 28 microns, about 29 microns, about 30 microns, about 31 microns, about 32 microns, about 33 microns, about 34 microns, about 35 microns, about 36 microns, about 37 microns, about 38 microns, about 39 microns, about 40 microns, about 41 microns, about 42 microns, about 43 microns, about 44 microns, about 45 microns, about 46 microns, about 47 microns, about 48 microns, about 49 microns, about 50 microns, about 51 microns, about 52 microns, about 53 microns, about 54 microns, about 55 microns, about 56 microns, about 57 microns, about 58 microns, about 59 microns, or about 60 microns.

The electrically conductive compositions described herein can be made by any suitable method, including a method comprising blending surface oxides formed on a surface of a eutectic gallium alloy into the bulk of the eutectic gallium alloy by shear mixing of the surface oxide/ alloy interface. Shear mixing of such compositions can induce a cross linked microstructure in the surface oxides; thereby forming a conducting shear thinning gel composition. A colloidal suspension of micro-structures can be formed within the eutectic gallium alloy/gallium oxide mixture, for example as, gallium oxide particles and/or sheets.

The surface oxides can be blended in any suitable ratio, such as at a ratio of between about 59.9% (by weight) and about 99.9% eutectic gallium alloy, to about 0.1% (by weight) and about 2.0% gallium oxide. For example percentage by weight of gallium alloy blended with gallium oxide is about 60%, 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, about 95%, about 96%, about 97%, about 98%, about 99%, or greater, such as about 99.9% eutectic gallium alloy while the weight percentage of gallium oxide is about 0.1%, about 0.2%, about 0.3%, about 0.4%, about 0.5%, about 0.6%, about 0.7%, about 0.8%, about 0.9%, about 1.0%, about 1.1%, about 1.2%, about 1.3%, about 1.4%, about 1.5%, about 1.6%, about 1.7%, about 1.8%, about 1.9%, and about 2.0% gallium oxide. In embodiments, the eutectic gallium alloy can include gallium-indium or gallium-indium-tin in any ratio of the recited elements. For example, a eutectic gallium alloy can include gallium and indium.

The weight percentage of gallium in the gallium-indium alloy can be between about 40% and about 95%, such as about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

Alternatively or in addition, the weight percentage of indium in the gallium-indium alloy can be between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

A eutectic gallium alloy can include gallium, indium, and tin. The weight percentage of tin in the gallium-indium-tin alloy can be between about 0.001% and about 50%, such as about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, or about 50%.

The weight percentage of gallium in the gallium-indium-tin alloy can be between about 40% and about 95%, such as about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

Alternatively or in addition, the weight percentage of indium in the gallium-indium-tin alloy can be between about 5% and about 60%, such as about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, or about 60%.

One or more micro-particles or sub-micron scale particles can be blended with the eutectic gallium alloy and gallium oxide. For example, the one or more micro-particles or sub-micron particles can be blended with the mixture with wt % of between about 0.001% and about 40.0% of micro-particles in the composition, for example about 0.001%, about 0.005%, about 0.01%, about 0.05%, about 0.1%, about 0.2%, about 0.3%, about 0.4%, about 0.5%, about 0.6%, about 0.7%, about 0.8%, about 0.9%, about 1%, about 1.5%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, or about 40. In embodiments the particles can be soda glass, silica, borosilicate glass, quartz, oxidized copper, silver coated copper, non-oxidized copper, tungsten, super saturated tin granules, glass, graphite, silver coated copper, such as silver coated copper spheres, and silver coated copper flakes, copper flakes or copper spheres or a combination thereof, or any other material that can be wetted by gallium. In some embodiments the one or more micro-particles or sub-micron scale particles are in the shape of spheroids, rods, tubes, a flakes, plates, cubes, prismatic, pyramidal, cages, and dendrimers. In certain embodiments, the one or more micro-particles or sub-micron scale particles are in the size range of about 0.5 microns to about 60 microns, as about 0.5 microns, about 0.6 microns, about 0.7 microns, about 0.8 microns, about 0.9 microns, about 1 microns, about 1.5 microns, about 2 microns, about 3 microns, about 4 microns, about 5 microns, about 6 microns, about 7 microns, about 8 microns, about 9 microns, about 10 microns, about 11 microns, about 12 microns, about 13 microns, about 14 microns, about 15 microns, about 16 microns, about 17 microns, about 18 microns, about 19 microns, about 20 microns, about 21 microns, about 22 microns, about 23 microns, about 24 microns, about 25 microns, about 26 microns, about 27 microns, about 28 microns, about 29 microns, about 30 microns, about 31 microns, about 32 microns, about 33 microns, about 34 microns, about 35 microns, about 36 microns, about 37 microns, about 38 microns, about 39 microns, about 40 microns, about 41 microns, about 42 microns, about 43 microns, about 44 microns, about 45 microns, about 46 microns, about 47 microns, about 48 microns, about 49 microns, about 50 microns, about 51 microns, about 52 microns, about 53 microns, about 54 microns, about 55 microns, about 56 microns, about 57 microns, about 58 microns, about 59 microns, or about 60 microns.

Examples

Example 1 is an apparatus, comprising: a substrate layer; a metal layer coupled to the substrate layer; and an encapsulant coupled to the substrate layer and the metal layer, the encapsulant configured to electrically isolate the metal layer from environmental conditions.

In Example 2, the subject matter of Example 1 includes, wherein the substrate layer is comprised of at least one of: a B-stage resin, a C-stage resin, and a stretchable adhesive film.

In Example 3, the subject matter of Example 2 includes, wherein the stretchable adhesive film is a stretchable thermoplastic adhesive film.

In Example 4, the subject matter of Examples 1-3 includes, wherein the encapsulant is comprised of a stretchable film.

In Example 5, the subject matter of Example 4 includes, wherein the stretchable film is comprised of at least one of: an elastomer, a B-stage thermosetting film, a C-stage thermosetting film, and a thermosetting resin.

In Example 6, the subject matter of Examples 1-5 includes, wherein the metal layer is comprised of copper.

In Example 7, the subject matter of Example 6 includes, wherein the copper is oxygen-free copper.

In Example 8, the subject matter of Examples 1-7 includes, wherein the metal layer is comprised of metal foil.

In Example 9, the subject matter of Example 8 includes, wherein the metal foil is etched to form a plurality of conductive traces.

In Example 10, the subject matter of Examples 1-9 includes, wherein the metal layer forms a plurality of conductive traces.

In Example 11, the subject matter of Example 10 includes, an electronic component; and a via extending through the substrate layer electrically coupling the electronic component to at least one of the conductive traces.

In Example 12, the subject matter of Example 11 includes, wherein the electronic component is secured to the substrate layer.

In Example 13, the subject matter of Example 12 includes, wherein the stencil-in-place structure is secured to one of the substrate layer or the encapsulant.

In Example 14, the subject matter of Examples 1-13 includes, wherein the encapsulant is comprised of a B-stage resin.

In Example 15, the subject matter of Examples 1-14 includes, wherein the metal layer forms a ground plane.

In Example 16, the subject matter of Examples 1-15 includes, wherein the substrate layer is comprised of an adhesive configured to secure the metal layer to the substrate layer.

In Example 17, the subject matter of Examples 1-16 includes, a textile secured to at least one of the encapsulant or the substrate layer.

In Example 18, the subject matter of Examples 1-17 includes, a stencil-in-place structure, comprising a stencil substrate layer and conductive gel secured within a channel and a via formed by the stencil substrate layer, the conductive gel electrically coupled to the metal layer.

Example 19 is an apparatus, comprising: a substrate layer; a metal layer coupled to the substrate layer; and an encapsulant coupled to the substrate layer and the metal layer, the encapsulant configured to electrically isolate the metal layer from environmental conditions; an electronic component coupled to at least one of the metal layer and the encapsulant; a stencil-in-place structure, comprising a stencil substrate layer and conductive gel secured within a channel and a via formed by the stencil substrate layer, the conductive gel electrically coupled to the metal layer.

In Example 20, the subject matter of Example 19 includes, wherein the electronic component is electrically coupled to the metal layer with conductive gel.

In Example 21, the subject matter of Example 20 includes, wherein the electronic component is mechanically coupled to the metal layer with a via in electrical contact with the conductive gel.

In Example 22, the subject matter of Example 19 includes, wherein the electronic component is electrically coupled to the metal layer with solder.

In Example 23, the subject matter of Example 22 includes, wherein the electronic component is mechanically coupled to the metal layer with the solder.

Example 24 is at least one machine-readable medium including instructions that, when executed by processing circuitry, cause the processing circuitry to perform operations to implement any of Examples 1-23.

Example 25 is an apparatus comprising means to implement of any of Examples 1-23.

Example 26 is a system to implement of any of Examples 1-23.

Example 26 is a method to implement of any of Examples 1-22.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or any suitable combination thereof), registers, or other machine components that receive, store, transmit, or display information. Furthermore, unless specifically stated otherwise, the terms "a" or "an" are herein used, as is common in patent documents, to include one or more than one instance. Finally, as used herein, the conjunction "or" refers to a non-exclusive "or," unless specifically stated otherwise.

What is claimed is:

1. An apparatus, comprising:

a substrate layer;

a metal layer coupled to the substrate layer, wherein the metal layer comprises a metal foil;

an encapsulant coupled to the substrate layer and the metal layer, the encapsulant configured to electrically isolate the metal layer from environmental conditions; and at least one via extending through the substrate layer coupling the metal foil to a pattern of traces formed on a surface of the substrate opposite the metal foil, wherein the via and the pattern of traces comprise a fluid phase conductor.

2. The apparatus of claim 1, wherein the substrate layer is comprised of at least one of: a B-stage resin, a C-stage resin, and a stretchable adhesive film.

3. The apparatus of claim 2, wherein the stretchable adhesive film is a stretchable thermoplastic adhesive film.

4. The apparatus of claim 1, wherein the encapsulant is comprised of a stretchable film.

5. The apparatus of claim 4, wherein the stretchable film is comprised of at least one of: an elastomer, a B-stage thermosetting film, a C-stage thermosetting film, and a thermosetting resin.

6. The apparatus of claim 1, wherein the metal layer is comprised of copper.

7. The apparatus of claim 6, wherein the copper is oxygen-free copper.

8. The apparatus of claim 1, wherein the metal layer is comprised of metal foil.

9. The apparatus of claim 8, wherein the metal foil is etched to form a plurality of conductive traces.

10. The apparatus of claim 1, wherein the metal layer forms a plurality of conductive traces.

11. The apparatus of claim 10, further comprising:

an electronic component; and a via extending through the substrate layer electrically coupling the electronic component to at least one of the conductive traces.

12. The apparatus of claim 11, wherein the electronic component is secured to the substrate layer.

13. The apparatus of claim 12, wherein the stencil-in-place structure is secured to one of the substrate layer or the encapsulant.

14. The apparatus of claim 1, wherein the encapsulant is comprised of a B-stage resin.

15. The apparatus of claim 1, wherein the metal layer forms a ground plane.

16. The apparatus of claim 1, wherein the substrate layer is comprised of an adhesive configured to secure the metal layer to the substrate layer.

17. The apparatus of claim 1, further comprising a textile secured to at least one of the encapsulant or the substrate layer.

18. An apparatus comprising:

a substrate layer;

a metal layer coupled to the substrate layer;

an encapsulant coupled to the substrate layer and the metal layer, the encapsulant configured to electrically isolate the metal layer from environmental conditions; and a stencil-in-place structure, comprising a stencil substrate layer and conductive gel secured within a channel and a via formed by the stencil substrate layer, the conductive gel electrically coupled to the metal layer.

19. An apparatus, comprising:

a substrate layer;

a metal layer coupled to the substrate layer; and an encapsulant coupled to the substrate layer and the metal layer, the encapsulant configured to electrically isolate the metal layer from environmental conditions;

an electronic component coupled to at least one of the metal layer and the encapsulant;

a stencil-in-place structure, comprising a stencil substrate layer and conductive gel secured within a channel and a via formed by the stencil substrate layer, the conductive gel electrically coupled to the metal layer.

20. The apparatus of claim 19, wherein the electronic component is electrically coupled to the metal layer with conductive gel.

21. The apparatus of claim 20, wherein the electronic component is mechanically coupled to the metal layer with a via in electrical contact with the conductive gel.

22. The apparatus of claim 19, wherein the electronic component is electrically coupled to the metal layer with solder.

23. The apparatus of claim 22, wherein the electronic component is mechanically coupled to the metal layer with the solder.

* * * * *